United States Patent

Yamaguchi et al.

(10) Patent No.: US 6,474,529 B2
(45) Date of Patent: Nov. 5, 2002

(54) WIRE BONDING APPARATUS

(75) Inventors: Toshiaki Yamaguchi, Tokyo (JP); Noriyuki Kubota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/987,807

(22) Filed: Nov. 16, 2001

(65) Prior Publication Data

US 2002/0063144 A1 May 30, 2002

(30) Foreign Application Priority Data

Nov. 29, 2000 (JP) .......................................... 2000-362403

(51) Int. Cl.⁷ .......................... B23K 37/04; B23K 31/02
(52) U.S. Cl. ...................................... 228/4.5; 228/180.5
(58) Field of Search ............................. 228/4.5, 180.5, 228/1.1, 110.1

(56) References Cited

U.S. PATENT DOCUMENTS

| | | | | | |
|---|---|---|---|---|---|
| 3,863,827 A | * | 2/1975 | Foulke et al. | ................. | 228/1.1 |
| 4,824,006 A | * | 4/1989 | Shimizu | ..................... | 118/668 |
| 5,169,050 A | * | 12/1992 | Montagu | .................... | 228/4.5 |
| 5,275,324 A | * | 1/1994 | Yamazaki et al. | ........... | 228/1.1 |
| 5,314,175 A | * | 5/1994 | Izumi et al. | ................. | 228/4.5 |
| 5,330,089 A | * | 7/1994 | Orcutt et al. | ................. | 228/1.1 |
| 5,340,010 A | * | 8/1994 | Torihata et al. | .............. | 228/1.1 |
| 5,556,022 A | * | 9/1996 | Orcutt et al. | ............... | 108/140 |
| 5,660,316 A | * | 8/1997 | Magni | ........................ | 228/1.1 |
| 5,735,449 A | * | 4/1998 | Magni | ...................... | 228/110.1 |
| 5,901,896 A | * | 5/1999 | Gal | ........................... | 228/180.5 |
| 5,907,269 A | * | 5/1999 | Zrostlik | ....................... | 335/215 |
| 5,931,452 A | * | 8/1999 | Nakatomi et al. | .......... | 269/216 |
| 6,102,275 A | * | 8/2000 | Hill et al. | .................... | 228/103 |
| 6,176,414 B1 | * | 1/2001 | Sadler | ........................ | 228/1.1 |
| 6,398,098 B1 | * | 6/2002 | Kada | ........................... | 228/1.1 |

FOREIGN PATENT DOCUMENTS

| JP | 358169918 A | * | 10/1983 |
| JP | 358184734 A | * | 10/1983 |
| JP | 361159744 A | * | 7/1986 |

OTHER PUBLICATIONS

US 2002/0063144A1 Yamaguchi et al. (May 30, 2002).*

* cited by examiner

Primary Examiner—Tom Dunn
Assistant Examiner—Kiley Stoner
(74) Attorney, Agent, or Firm—Sughrue Mion, PLLC

(57) ABSTRACT

A wire bonding apparatus, which realizes a reduction in weight and inertia of a bonding arm and which allows high-speed Z-axis swinging, is disclosed. The wire bonding apparatus comprises a bonding head 3 fixed to an X–Y stage 30, a bonding arm 4 swinging in the Z-axis direction around a bonding head swinging shaft 13, a pair of wire clamp portions 7a and 7b, and an actuator for driving at least one of wire clamp portions 7a and 7b. At least, one portion of the actuator is provided on the bonding head 3 fixed onto the X–Y stage 30 so as to be spaced apart from the bonding arm 4, whereby a reduction in the weight and inertia of the bonding head 3 is achieved.

13 Claims, 11 Drawing Sheets

(PRIOR ART)

(PRIOR ART)

(a) HIGH-SPEED DESCENT
(b) SEARCH
(c) US JUNCTION
(d) REVERSE
(e) LOOP-UP
(f) LOOP-DOWN
(g) SECOND SEARCH
(h) US JUNCTION
(i) FEED-UP/CLAMP
(j) WIRE-CUT/HIGH-SPEED-ASCENT
(k) BALL UP

WIRE BONDING APPARATUS

BACKGROUND OF THE INVENTION

1. Field of the Invention

The present invention relates to a wire bonding apparatus and, in particular, to a wire bonding apparatus having a distinctive wire clamp mechanism (device) for performing wire cutting/clamping in a wire bonding process.

2. Description of the Related Art

A wire clamp mechanism provided in a conventional wire bonding apparatus includes a stationary side wire clamp portion fixed to a bonding arm, a movable side wire clamp portion arranged in a scissors-like fashion with respect to the stationary side wire clamp portion and adapted to swing using one point as a fulcrum, and a clamp VCM (voice coil motor) connected to the movable side wire clamp portion and adapted to drive the movable side wire clamp portion.

The wire clamp device of this conventional wire bonding apparatus will be described in detail with reference to FIGS. 1 and 2. FIG. 1 is a top view showing an example of the wire clamp device provided in the conventional wire bonding apparatus, and FIG. 2 is a side view thereof. FIG. 3 is a diagram illustrating a wire bonding sequence.

As shown in FIGS. 1 and 2, in the conventional wire bonding apparatus, an X–Y stage 30 composed of an X-axis stage 1 and a Y-axis stage 2 are provided on a bonding apparatus base 14, and a bonding arm 4 is provided on a bonding head 3 secured to the X–Y stage 30. Then, the bonding arm 4 holds a horn 5 serving as a bonding tool, and a capillary 6 is secured to the forward end of the horn 5.

A gold wire 9 is passed through the capillary 6, and the gold wire 9 is held between a stationary wire gripping part 8 of stationary side wire clamp portion 7a and a movable wire gripping part 10 of a movable side wire clamp portion 7b at a position above the capillary 6. A coil 23 of a clamp VCM is connected to the movable side wire clamp portion 7b, and the coil 23 causes the movable side wire clamp portion 7b to swing on a fulcrum 15 to hold the gold wire 9 with the stationary side wire clamp portion 7a. Further the bonding arm 4 on which the wire clamp device is mounted swings at high speed around a bonding arm swinging shaft 13.

FIG. 3 shows the wire bonding sequence of the wire bonding apparatus. In FIG. 3, the horizontal axis indicates time, and the vertical axis indicates a height of the capillary 6 in the Z-axis direction.

First, in a state in which the gold wire 9 passed through the capillary 6 is not gripped by the wire clamp device, the Z-direction rotation portion including the wire clamp device and the bonding capillary 6 is lowered at a high speed (a). Further, search on the bonding part is executed in (b), US junction is effected in (c), a predetermined amount of the gold wire 9 is reversed in (d), loop-up is effected in (e), and then loop-down is effected in (f).

Next, a second search is executed in (g), and a second bonding (US junction) is effected in (h). Subsequently, feed-up is effected in (i), and, in a state in which the gold wire 9 is gripped by the driving of the clamping VCM movable coil 23, a high-speed ascent is effected by the driving of the Z-axis VCM 23 in (j). After cutting the gold wire 9 connected at the second bonding point, sparking is performed and releasing the wire clamp device, and the gold ball due to the sparking is raised in (k). That is, in wire clamping, when second bonding has been completed (h) and feed-up operation has been completed (i), a clamp VCM coil 23 is driven to hold the gold wire 9, and ascent is effected in that state, thereby cutting the gold wire 9 connected at the second bonding point (j).

In the conventional bonding apparatus constructed as described above, the bonding arm 4 swings around the bonding arm swinging shaft 13 which extends horizontally, at high speed to perform wire bonding at high speed. To realize a high-speed swinging of the Z-axis (vertical direction), it is necessary to reduce the weight of the wire clamp device and to reduce inertia thereof around the swinging shaft. In the conventional wire clamp device, however, an actuator for driving the movable side wire clamp portion 7b of the wire clamp device is mounted on the bonding arm 4, so that it is difficult to achieve a reduction in the total weight and in the total inertia of the bonding arm 4 including the wire clamp device.

SUMMARY OF THE INVENTION

The present invention has been made in view of the above problem in the prior art. It is a main object of the present invention to provide a wire bonding apparatus, which realizes a reduction in the weight and inertia of a wire clamp section applied to the bonding arm, thereby allowing a high-speed swinging of the Z-axis.

To achieve the above object, according to the present invention, there is provided a wire bonding apparatus including an X–Y stage composed of an X stage and a Y stage moving, horizontally, X- and Y-directions, respectively, a swinging shaft fixed onto the X–Y stage, a bonding arm swinging in the Z-axis direction (vertical direction) perpendicular to the X- and Y-directions, around the swinging shaft, a pair of wire clamp portions gripping a bonding wire, and an actuator for driving the pair of wire clamp portions, wherein at least a part of the actuator and the wire clamp portions is separated from the bonding arm portion and fixed onto the X–Y stage. Favorably, a bonding head is fixed onto the X–Y stage and the part of the actuator and the wire clamp portions is fixed to the bonding head.

Further, the wire bonding apparatus may be constructed such that the entire actuator is separated from the bonding arm and fixed onto the X–Y stage.

Moreover, the wire bonding apparatus may be constructed such that the actuator is composed of a stationary side actuator portion and a movable side actuator portion movable along the stationary side actuator portion, and the stationary side actuator portion is separated from the bonding arm portion and fixed onto the X–Y stage, favorably, fixed onto the X–Y stage via a bonding head which is fixedly mounted on the X–Y stage.

Furthermore, the wire bonding apparatus may be constructed such that the actuator is connected to the X–Y stage by an elastic member, moves integrally with the bonding arm only when gripping the bonding wire, and is separated from the bonding arm when not gripping the bonding wire.

Still more, the wire bonding apparatus may be constructed such that the wire clamp portions are connected to the X–Y stage by an elastic member, move integrally with the bonding arm only when gripping the bonding wire, and are separated from the bonding arm portion when not gripping the bonding wire.

Further still, the wire bonding apparatus maybe constructed such that a protrusion equipped with a freely rolling ball is provided in the wire clamp side end portion of the actuator, and wherein when the bonding arm swings in the Z-axis direction, the ball provided on the protrusion abuts the wire clamp portion while rolling to pressurize the wire clamp portion.

Yet further, the wire bonding apparatus may be constructed such that the actuator is formed so as to be movable also in the Z-axis direction, and wherein when the bonding arm swings in the Z-axis direction, the wire clamp portion and at least a part of the actuator move together while in contact with each other.

Still moreover, the wire bonding apparatus may be constructed such that the movable side actuator portion is formed as a plate extending in the Z-axis direction, and wherein when the bonding arm swings in the Z-axis direction, the stationary side actuator portion pressurizes the wire clamp portion while deviating in the Z-axis direction.

Yet moreover, the wire bonding apparatus maybe constructed so as to include a driving force transmission means provided between the actuator and the wire clamp and separated from the bonding arm, wherein the pressurizing force of the actuator is transmitted to the wire clamp portion through the driving force transmission means.

Still furthermore, the wire bonding apparatus may be constructed such that the actuator includes one of a VCM, a linear motor, an electrostrictive element, and a magnetostrictive element.

Thus, in accordance with the present invention, at least a part of the wire clamp portion and a section of the actuator for driving the wire clamp portion or the driving force transmitting means for transmitting the reciprocal movement of the actuator to the wire clamp portion is mounted outside the bonding arm to achieve a reduction in the total weight and total inertia of the bonding arm, making it possible to realize a high-speed Z-axis swinging of the bonding arm.

DESCRIPTION OF THE PREFERRED EMBODIMENTS

Figure 1:
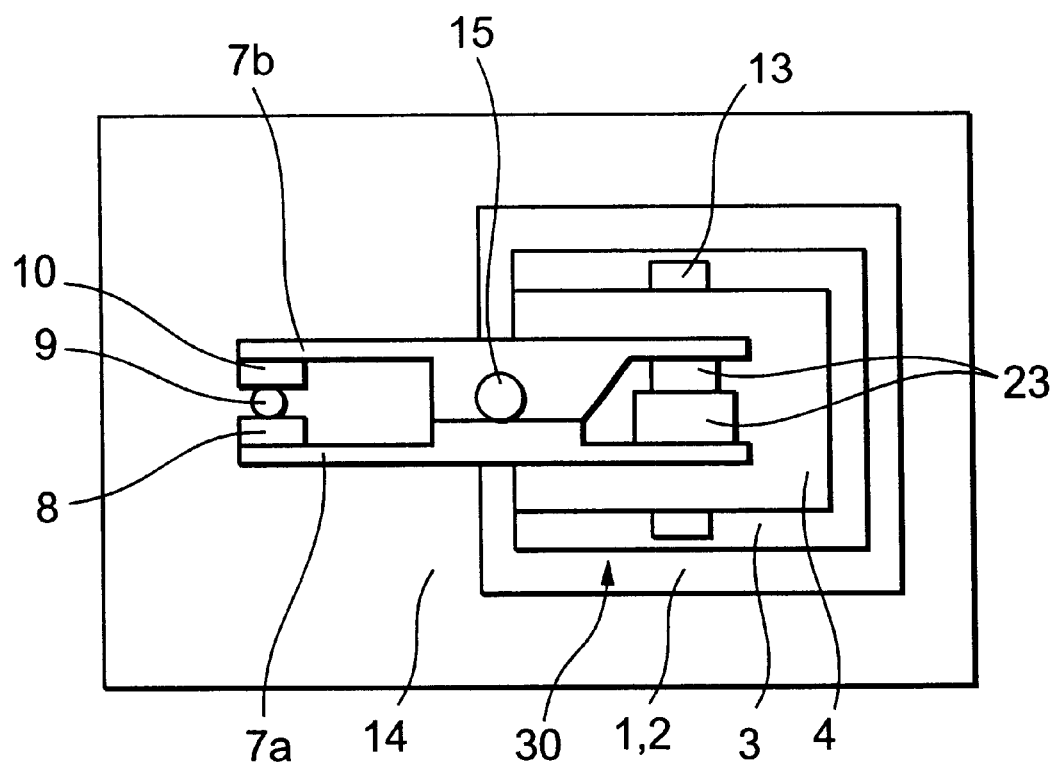
FIG. 1 is a top view of a conventional wire bonding apparatus.
Figure 2:
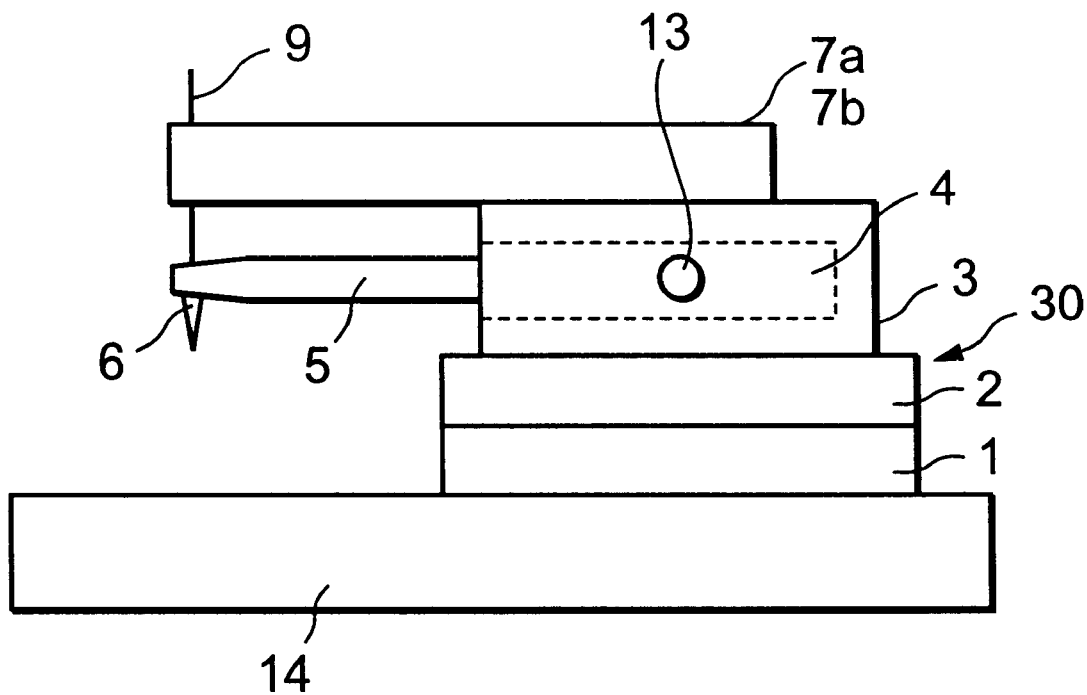
FIG. 2 is a side view of a conventional wire bonding apparatus.

In a preferred embodiment of the wire bonding apparatus according to the present invention, an X–Y stage 30 composed of an X stage 1 and a Y stage 2 horizontally moving X-and Y-directions, respectively, is secured on a wire bonding apparatus base 14. A bonding head 3 is fixed onto the X–Y stage 30, and a bonding arm 4 is provided so as to swing in the Z-direction (vertical direction) perpendicular to the X-and Y-directions through a bonding head swinging shaft 13 extending horizontally. An actuator for driving at least one of a pair of wire clamp portions 7a and 7b is provided on the bonding head 3 fixed onto the X–Y stage 30 at a position spaced apart from the bonding arm 4, whereby a reduction in the total weight and total inertia of the bonding head 3 including the wire clamp device section is achieved and the bonding wire is reliably clamped by the pair of wire clamp portions.

To describe the above-mentioned embodiment mode of the present invention in more detail, embodiments of the present invention will now be described with reference to the drawings.

[Embodiment 1]

Figure 4:
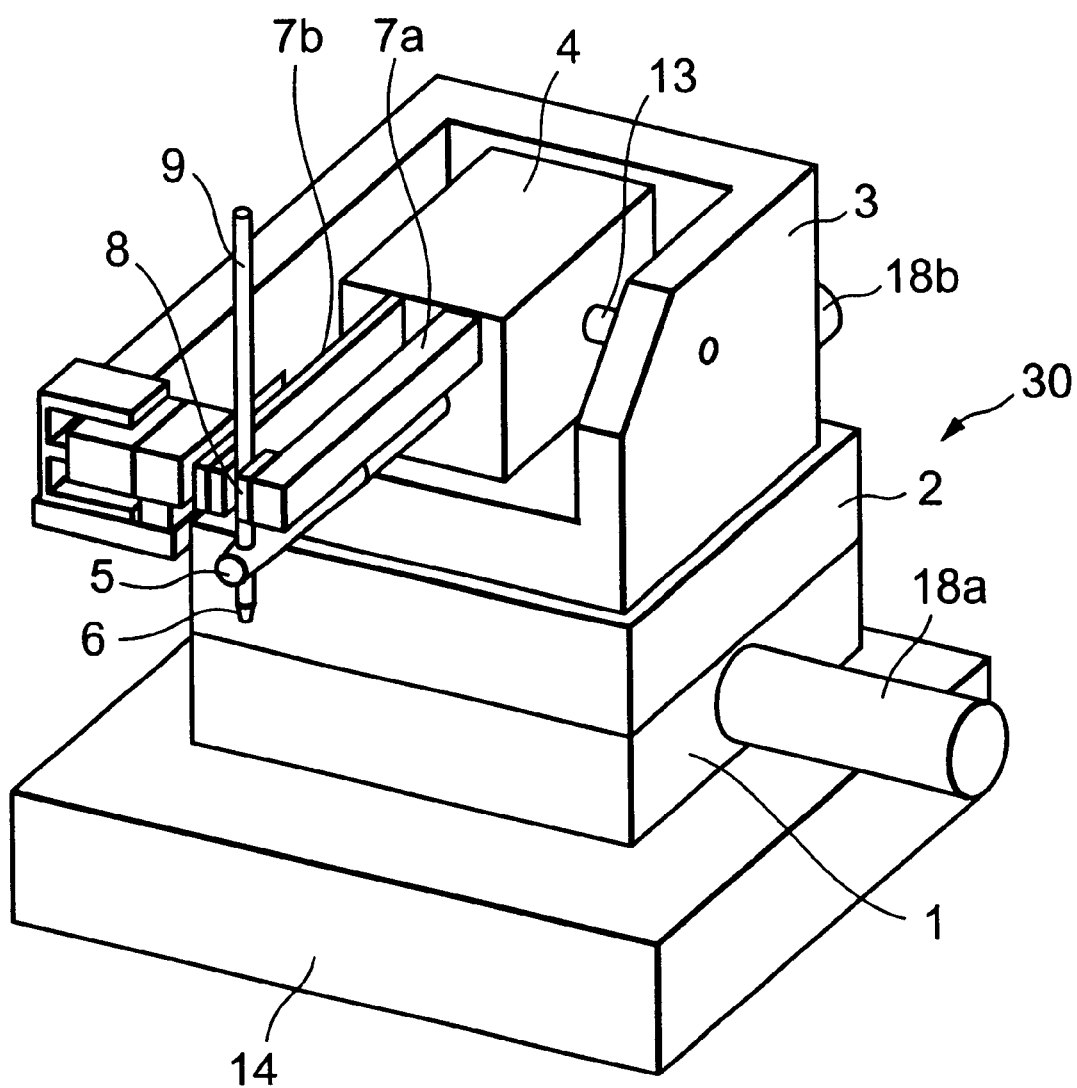
FIG. 4 is a general view of a wire clamp device provided in a wire bonding apparatus according to a first embodiment of the present invention.

First, a wire bonding apparatus according to a first embodiment of the present invention will be described with reference to FIGS. 4 and 5. FIG. 4 is a general perspective view of a wire clamp device provided in a wire bonding apparatus according to this embodiment, and FIG. 5 is an enlarged perspective view of the movable side wire clamp portion.

Figure 5:
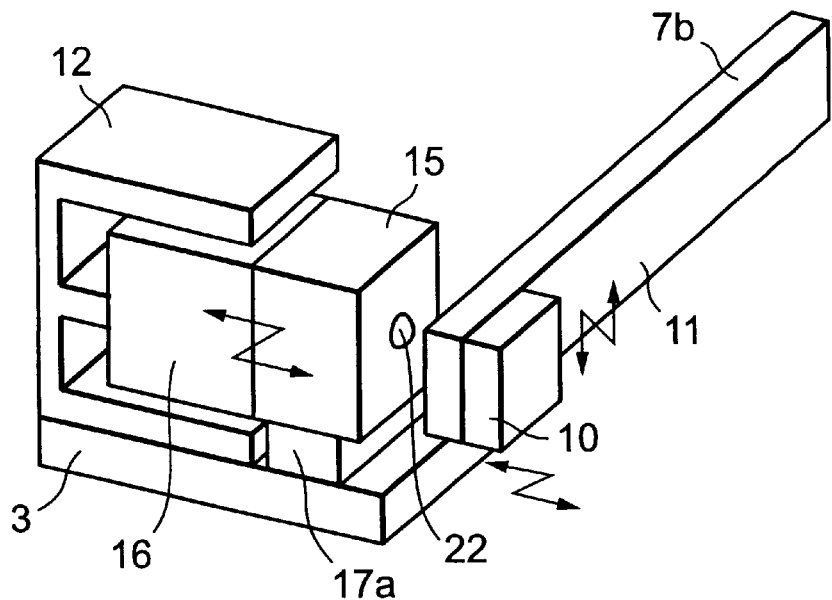
FIG. 5 is a partial enlarged view of a wire clamp device provided in a wire bonding apparatus according to the first embodiment of the present invention.

First, referring to FIGS. 4 and 5, the wire bonding apparatus of this embodiment includes an X–Y stage composed of an X stage 1 and Y stage 2 which are placed on a wire bonding device base 14, an X-axis stage actuator 18a and a Y-axis stage actuator 18b for respectively driving the X and Y stages, a bonding head 3 fixed onto the X and Y stages 1 and 2, and a bonding arm 4 driven in the Z-axis direction around a bonding arm swinging shaft 13 provided in the bonding head 3.

The wire clamp device includes a stationary side wire clamp portion 7a, a movable side wire clamp portion 7b, a stationary wire gripping part 8 provided at the forward end of the stationary side wire clamp portion 7a, a movable wire gripping part 10 provided on the movable side wire clamp portion 7b. A thin gold wire 9 as a bonding wire is clamped between the stationary wire gripping part 8 and the movable wire gripping part 10. The movable side wire clamp portion 7b provides or is made of a plate spring portion 11 to which the movable wire gripping part 10 is attached and which is elastically deformed by the actuator from outside the wire clamp portion.

Then, on the outer side of the movable wire gripping part 10, there are provided a stationary side actuator portion 12 attached to the bonding head 3, that is, attached to the X–Y stage 30 through the bonding head 3 and operating the movable wire gripping part 10, a movable side actuator portion 16, a block 15 attached to the movable side actuator portion and serving to operate the movable wire griping part 10, a guide 17a for guiding the block 15, and a ball 22 mounted to the block 15 and adapted to roll while in contact with the plate spring 11 operating around the bonding arm swinging shaft 13.

The wire clamping operation of this wire bonding apparatus will be described. The stationary side wire clamp portion 7a including the stationary wire gripping part 8 and the movable side wire clamp portion 7b including the movable wire gripping part 10 are mounted to the swinging Z-axis bonding arm 4 on the X–Y stage 30. The bonding arm 4 holds a horn 5 serving as a bonding tool, and a capillary 6 is fixed to the forward end of the horn 5. The gold wire 9 is passed through this capillary 6 and is held between the stationary wire gripping part 8 and the movable wire gripping part 10 at a position above the capillary 6.

The movable wire gripping part 10 is mounted to the forward end of the elastically deformable plate spring 11, and the plate spring 11 is mounted to the bonding arm 4. Then, the actuator portions 12 and 16 including VCM (voice coil motor) is mounted to the bonding head 3 holding the swinging bonding arm 4. The block 15 is mounted to the movable side actuator portion 16, and the ball 22 of hard steel is mounted to the forward end of the block 15. The block 15 is guided by the guide 17a. By the operation of the actuators 12 and 16, the block 15 pushes the plate spring portion 11 and the movable wire gripping part 10 through the boll 22 to clamp the gold wire 9. That is, when the actuator portions 12 and 16 are driven, the ball 22 mounted to the forward end of the block 15 comes into contact with the movable side wire clamp portion 7b composed of the plate spring 11 and the movable wire gripping part 10, and the plate spring 11 undergoes an elastic deformation to hold the gold wire 9 between the movable wire gripping part 10 and the stationary wire gripping part 8. Since the wire clamp operates around the bonding arm swinging shaft 13 while holding the gold wire 9, the ball 22 rolls while being held in contact with the plate spring 11. The release of the gold wire 9 is effected by moving the movable side actuator portion 16 away from the movable side wire clamp portion 7b and restoring the deflected plate spring 11 to the original state.

Thus, in the wire bonding apparatus of this embodiment, the stationary and movable wire gripping parts 8 and 10 for gripping the gold wire 9 are provided on the bonding arm 4 swinging on the Z-axis, and the actuator portions 12 and 16 for operating the movable wire gripping part 10 are provided on the bonding head 3 fixed onto the X–Y stage 30, whereby, as compared with the conventional structure in which the actuator portions are provided on the bonding arm, it is possible to achieve a reduction in the total weight and total inertia of the bonding arm 4 including the wire clamp portion, making it possible to cause the bonding arm 4 at high speed in the Z-direction.

When the wire clamp portions 7a and 7b swing on the Z-axis, positional deviation in the Z-axis occurs between the wire clamp portions 7a and 7b and the actuator portions. In this embodiment, however, the ball 22 is provided at the forward end of the block 15 mounted to the movable side actuator 16, and this ball 22 pressurizes the movable side wire clamp portion 7b while rolling, so that it is possible to reduce the contact friction and always maintain the pressurizing force at a fixed level.

[Embodiment 2]

Figure 6:
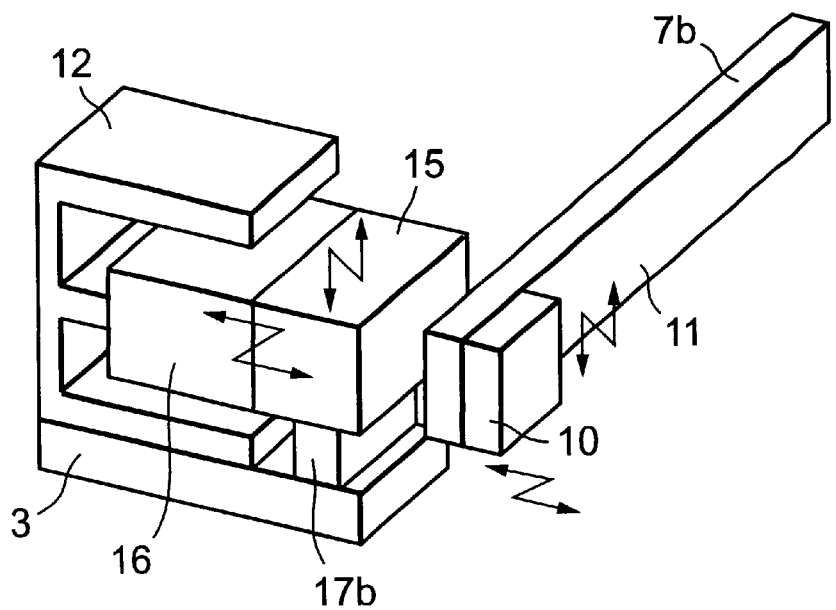
FIG. 6 is a partial enlarged view of a wire clamp device provided in a wire bonding apparatus according to a second embodiment of the present invention.

Next, a wire bonding apparatus according to a second embodiment of the present invention will be described with reference to FIG. 6. FIG. 6 is an enlarged perspective view of the movable side wire clamp portion of the wire clamp device provided in the wire bonding apparatus of the second embodiment. This embodiment is an improvement over the first embodiment in terms of the movable clamp portion, and the other components are of the same construction as the first embodiment.

The wire bonding apparatus of this embodiment will be described with reference to FIG. 6. As in the first embodiment, there are provided on the wire bonding apparatus base 14, the X–Y stage 30, the bonding head 3, the bonding arm 4 fixed to the bonding head 3 and rotatable around the bonding arm swinging shaft 13, the stationary and movable wire clamp portions 7a and 7b, the movable wire gripping part 10, the stationary wire gripping part 8, the stationary side actuator portion 12 and the movable side actuator portion 16 which are slidable in Z-direction, the block 15 mounted to the movable side actuator 16, and a guide 17b slidable in the X-, Y-, and Z-directions.

The operation of the wire bonding apparatus constructed as described above will be described. When the stationary and movable side actuator portions 12 and 16 mounted to the X–Y stage 30, the block 15 is guided by the guide 17b and the plate spring 11 is caused to undergo the elastic deformation, the gold wire 9 being held between the movable wire gripping part 10 and the stationary wire gripping part 8.

Figure 3:
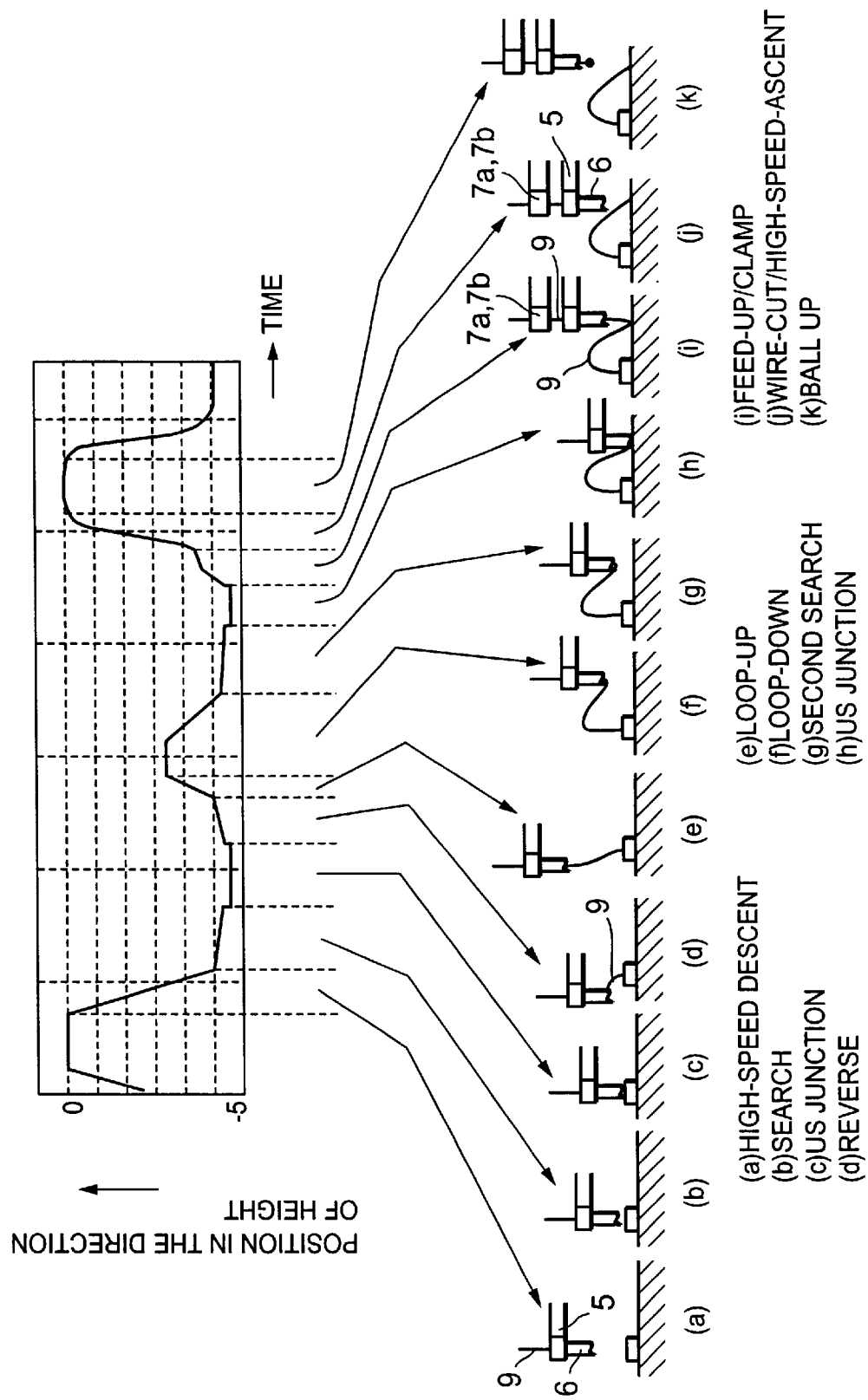
FIG. 3 is a diagram showing a wire sequence for a wire bonding apparatus.

Then, according to the bonding sequence shown in FIG. 3, the wire clamp portions 7a and 7b ascend while clamping the gold wire 9. Since in this embodiment the guide 17b is slidable in the X-, Y-, and Z-directions, the block 15 pressurizes the plate spring 11 to cause it to undergo the elastic deformation and, in this state, is guided by the guide 17b to ascend together with the movable side actuator portion 16. The release of the gold wire 9 is effected by moving the movable side actuator portion 16 away from the movable side wire clamp portion 7b to restore the deflected plate spring 11 to the former condition.

Thus, as in the first embodiment described above, in the wire bonding apparatus of this embodiment, there are provided the stationary and movable wire gripping parts 8 and 10 for gripping the gold wire 9 on the Z-axis for swinging, and the actuator portions 12 and 16 for operating the movable wire gripping part 10 are provided on the bonding head 3 fixed onto the X–Y stage, so that it is possible to achieve a reduction in the total weight and total inertia of the bonding arm 4 including the stationary side wire clamp portion 7a and to swing the bonding arm 4 at high speed in the Z-axis direction. Further, since the actuator portions 12 and 16 which are slidable in the Z-axis direction are guided by the guide 17b slidable in the X-, Y-, and Z-directions, the elastic deformation of the plate spring portion 11 can be reliably effected.

[Embodiment 3]

Figure 7:
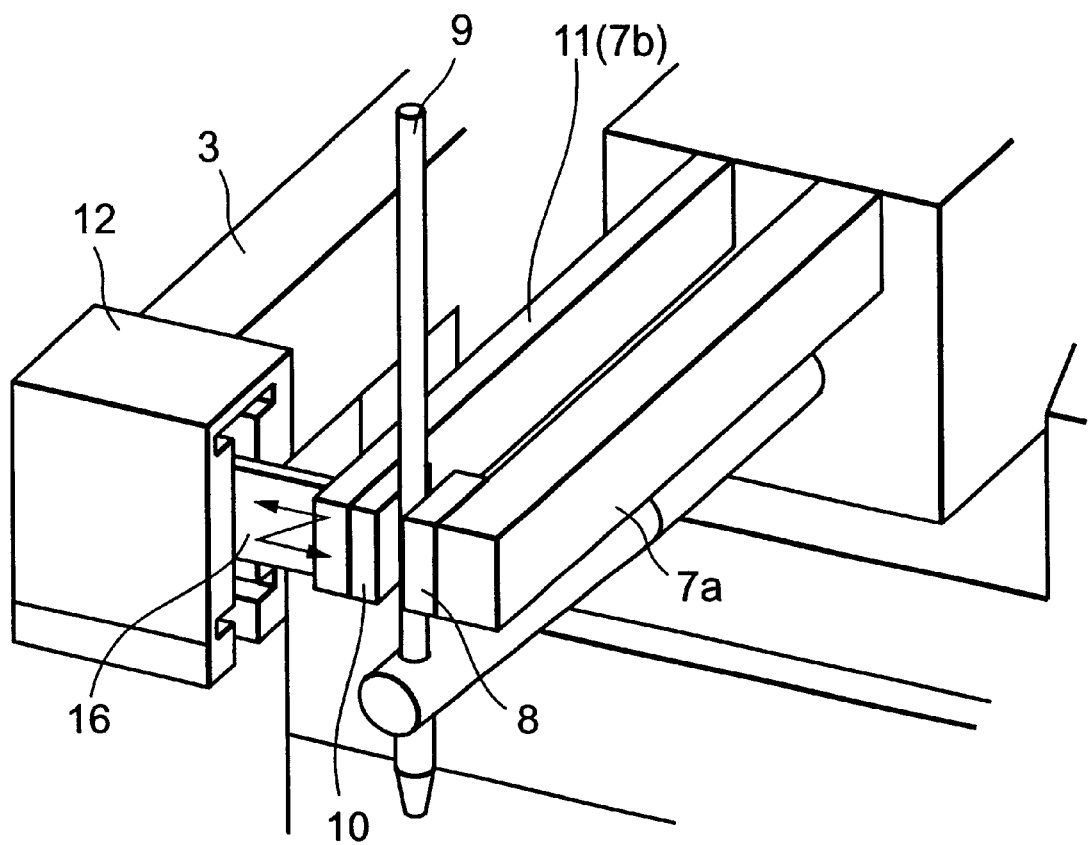
FIG. 7 is a partial enlarged view of a wire clamp device provided in a wire bonding apparatus according to a third embodiment of the present invention.

Next, a wire bonding apparatus according to a third embodiment of the present invention will be described with reference to FIG. 7. FIG. 7 is an enlarged perspective view of the movable side wire clamp portion of the wire clamp device provided in the wire bonding apparatus of the third embodiment. This embodiment is characterized by the fact that the movable side actuator portion is secured to the wire gripping part side, but otherwise it is the same as the first and second embodiments described above.

The wire bonding apparatus of the third embodiment will be described with reference to FIG. 7. As in the first and second embodiments, there are provided on the wire bonding apparatus base 14 the X–Y stage 30, the bonding head 3, the bonding arm 4 rotatable around the bonding arm swinging shaft 13 fixed to the bonding head 3, the stationary and movable wire clamps 7a and 7b, the stationary and movable wire gripping parts 8 and 10, the plate-like movable side actuator portion 16 mounted to the movable side wire clamp portion 7b and extending in the Z-axis direction, and the stationary side actuator portion 12 mounted to the bonding head 3.

The operation of this wire bonding apparatus, constructed as described above, will be described. When the stationary side actuator portion 12 mounted to the bonding head 3 and the movable side actuator portion 16 mounted to the movable wire clamp portion 7b are operated, the plate spring 11 undergoes elastic deformation, and the gold wire 9 is held between the movable wire gripping part 10 and the stationary wire gripping part 8. Then, according to the bonding sequence, the wire clamp portions 7a and 7b ascend while clamping the gold wire 9. Since the movable side actuator portion 16 of this embodiment is formed as a plate extending in the Z-axis direction, it is possible to reliably effect elastic deformation of the plate spring 11 and pressurize the movable wire gripping part 10 even if the positions in the Z-axis directions of the actuator portions 12 and 16 are displaced.

Thus, in the wire bonding apparatus of this embodiment, of the actuators operating the movable wire gripping part 10, only the stationary side actuator portion 12 is provided on the X–Y stage 30, so that, as compared with the conventional wire clamp device, it is possible to achieve a reduction in the total weight and total inertia of the bonding arm 4 including the sections of the clamp device. Further, since the movable side actuator portion 16 is formed as a plate extending in the Z-axis direction, it is possible to reliably hold the gold wire 9 with respect to the movement in the Z-axis direction.

[Embodiment 4]

Figure 8:
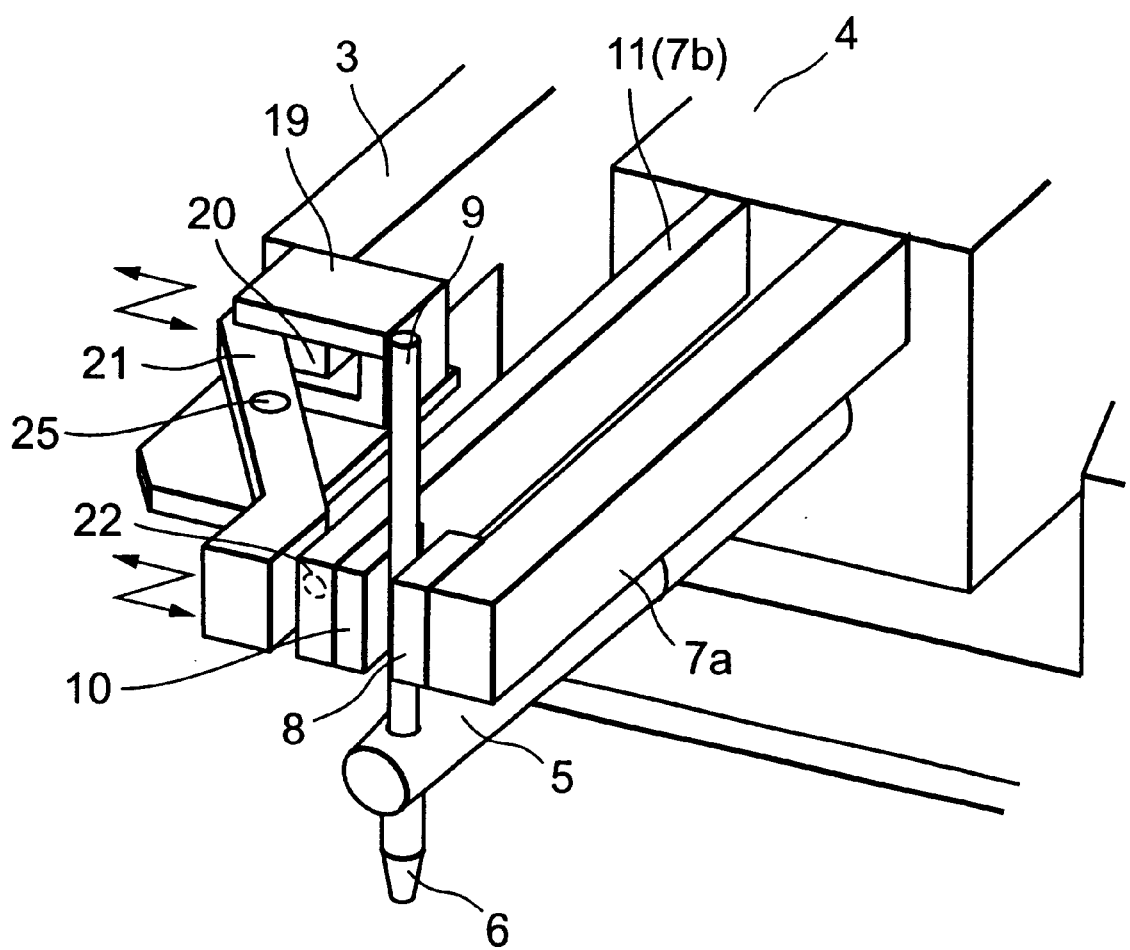
FIG. 8 is a partial enlarged view of a wire clamp device provided in a wire bonding apparatus according to a fourth embodiment of the present invention.

Next, a wire bonding apparatus according to a fourth embodiment of the present invention will be described with reference to FIG. 8. FIG. 8 is an enlarged perspective view of the movable side wire clamp portion of the wire clamp device provided in the wire bonding device of the fourth embodiment. In this embodiment, a force transmission mechanism for transmitting the movement of the actuator portions is added to the wire clamp device, but otherwise, it is of the same construction as the first through third embodiments.

As shown in FIG. 8, like the first embodiment described above, the wire bonding apparatus of the fourth embodiment is characterized by including the X–y stage 30, the bonding head 3, the bonding arm 4, the stationary and movable side wire clamp portions 7a and 7b, the stationary and movable wire gripping parts 8 and 10, the actuator portion 19 of VCM magnetic circuit mounted to the bonding head 3, the actuator portion 20 of VCM coil mounted to the bonding head 3, and the ball 22 adapted to roll while in contact with the wire clamp. Further, the force transmission mechanism 21 for operating the movable wire gripping portion 10 by the actuators 19 and 20 is mounted to the bonding head 3.

In this wire bonding apparatus, constructed as described above, the actuator portions 19 and 20 mounted to the X–Y stage 30 are driven, and this driving force is transmitted through the force transmission mechanism 21 provided likewise on the X–Y stage 30 to the movable wire gripping portion 10 on the Z-axis swinging to thereby make it possible to hold and release the gold wire 9. Thus, although it involves a rather complicated structure, this embodiment makes it possible to arbitrarily set the position where the actuator portions 19 and 20 are placed, so that an increase in the degree of freedom in design is achieved. Further, it is possible to simplify the structure of the forward end portion of the wire clamp portion. In this embodiment, while the wire clamp holds the gold wire 9, the ball 22 between the force transmission mechanism 21 and the plate spring 11 rolls in a contact state, making it possible to reliably transmit the pressurizing force of the actuator portions also with respect to the movement in the Z-axis direction of the wire clamp portion.

While in this embodiment the force transmission mechanism 21 includes a bar-like member rotating using a fulcrum 25 as the axis, it is obviously possible to adopt some other type of structure as long as it allows the movement of the actuator portions to be transmitted to the wire clamp portion.

[Embodiment 5]

Figure 9:
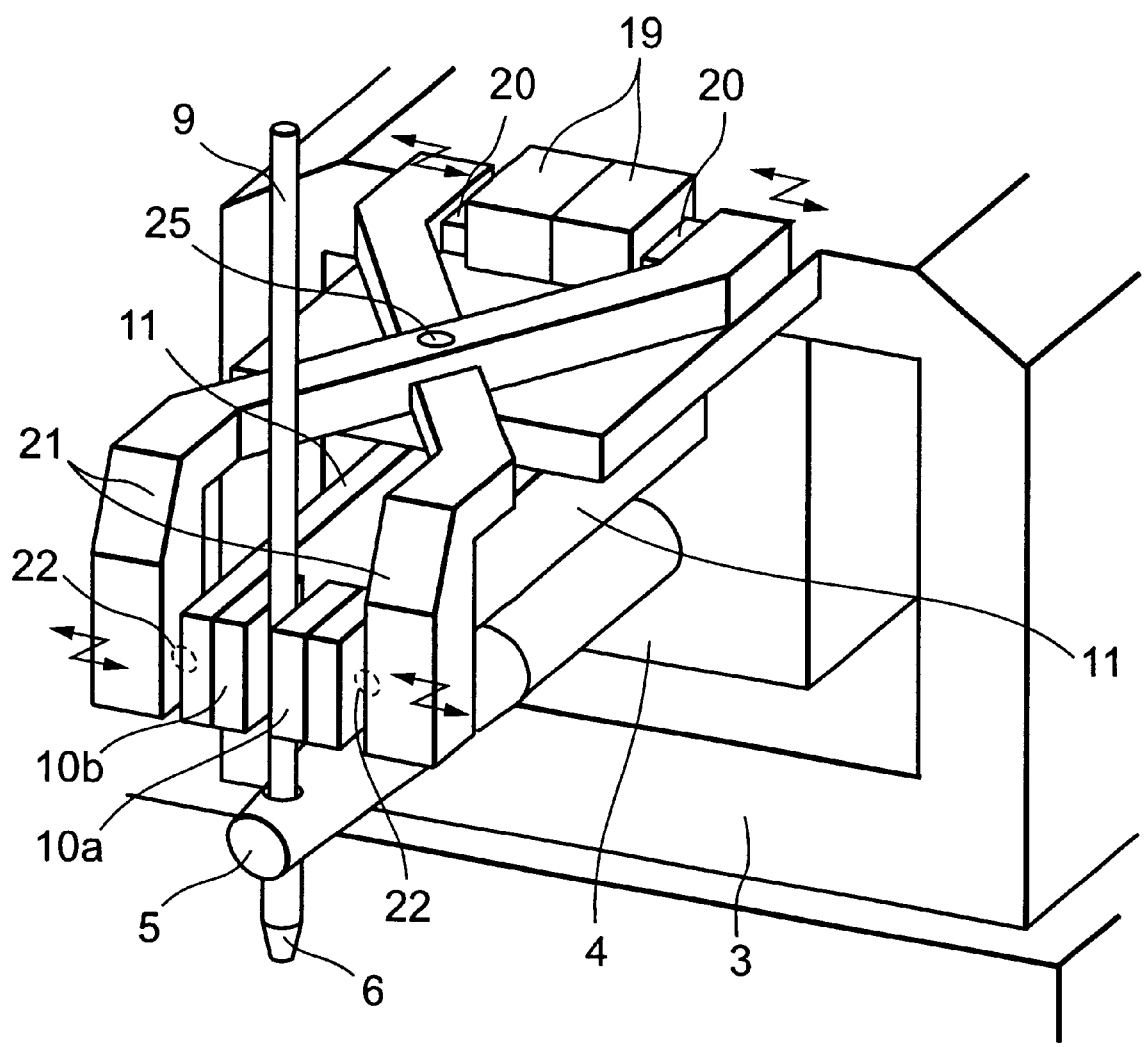
FIG. 9 is a partial enlarged view of a wire clamp device provided in a wire bonding apparatus according to a fifth embodiment of the present invention.

Next, a wire bonding apparatus according to a fifth embodiment of the present invention will be described with reference to FIG. 9. FIG. 9 is an enlarged perspective view of the wire clamp portion of the wire clamp device provided in the wire bonding apparatus of the fifth embodiment. This embodiment is characterized in that both sides of the wire clamp portion are driven, but otherwise, it is of the same construction as the first through fourth embodiments.

As shown in FIG. 9, the wire bonding apparatus of the fifth embodiment is characterized in that both the movable side wire clamp portion 7b and the stationary side wire clamp portion 7a are made of plate spring portions 11, and actuator portions 19 and 20 for operating two wire gripping parts 10a and 10b and the force transmission mechanism 21 are mounted to the bonding head 3.

In this wire clamp device, constructed as described above, the two actuator portions 19 and 20 mounted to the bonding head 3 holding the swinging Z-axis are driven and the wire gripping parts 10a and 10b on the swinging Z-axis are operated through the force transmission mechanism 21 so as to hold them on both sides, thereby making it possible to hold and release the gold wire 9. Thus, as compared with the first through fourth embodiments, the gold wire 9 can be held with a greater force. While the wire clamp is holding the gold wire 9, the balls 22 between the force transmission mechanism 21 and the plate springs 11 roll in a contact state, making it possible to reliably pressurize the wire gripping portion also with respect to the movement in the Z-axis direction.

[Embodiment 6]

Figure 10:
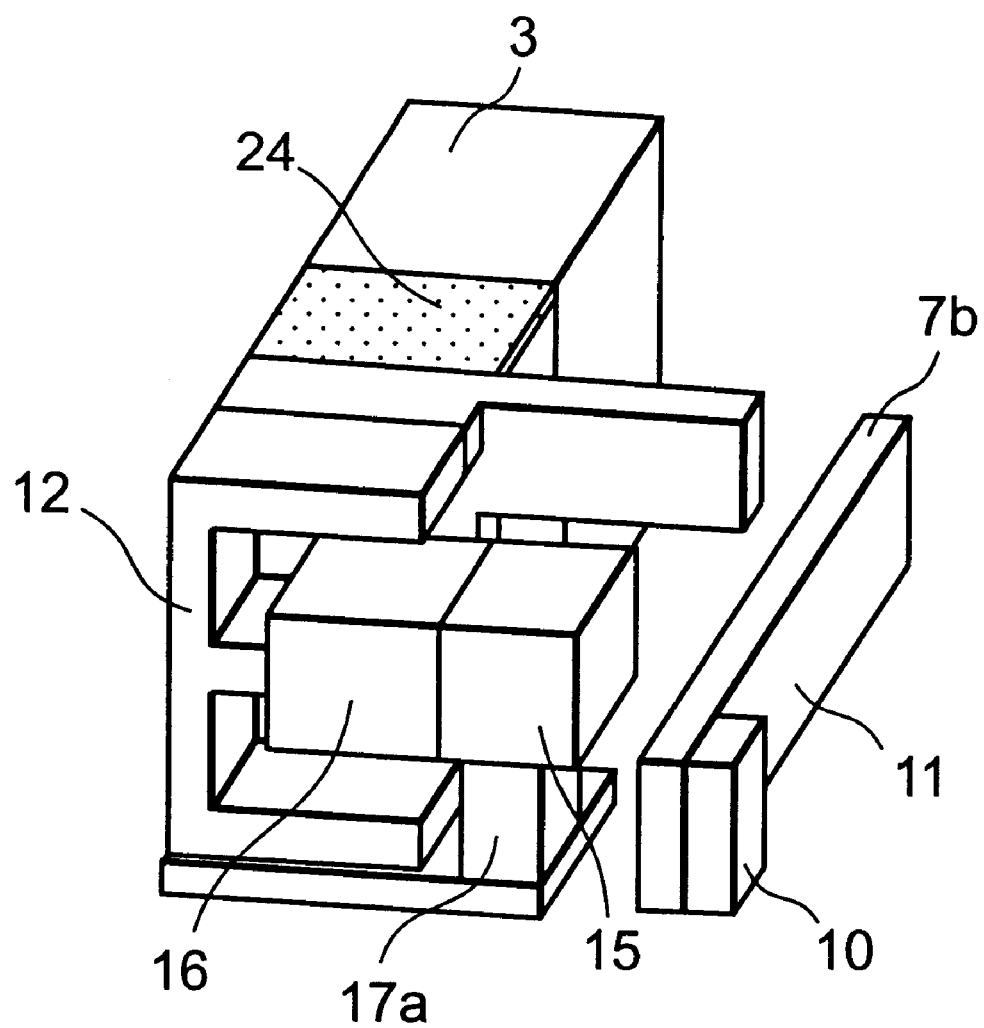
FIG. 10 is a partial enlarged view showing how bonding-arm/actuator separation is effected in a wire clamp device provided in a wire bonding apparatus according to a sixth embodiment of the present invention.
Figure 11:
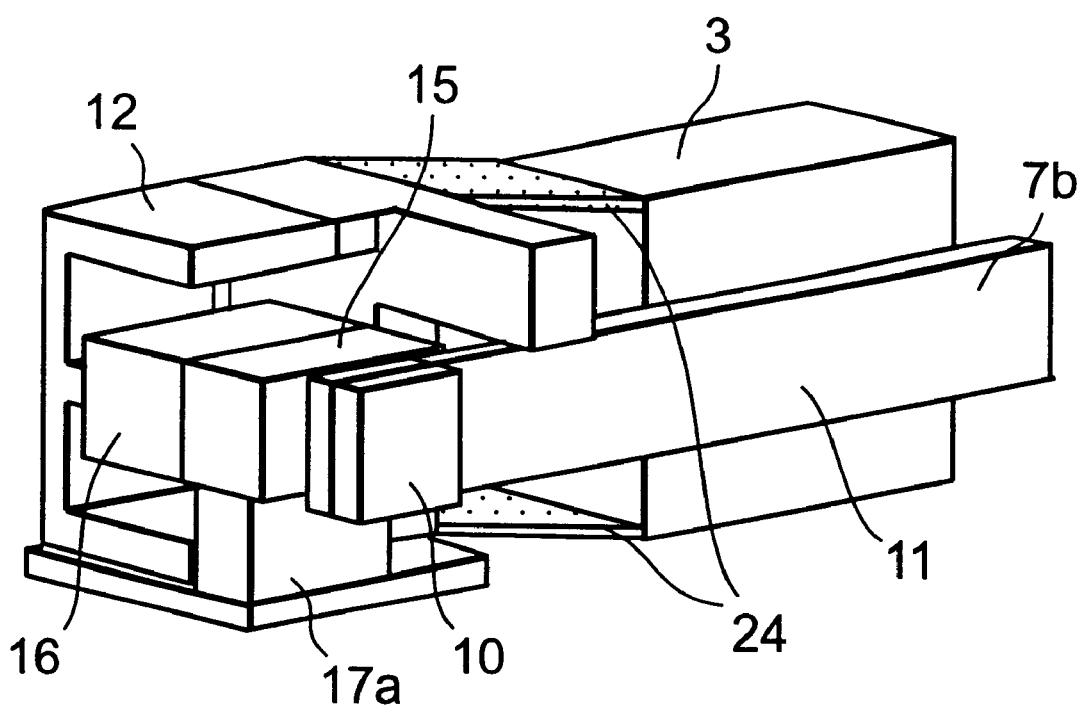
FIG. 11 is a partial enlarged view showing how bonding-arm/actuator integration is effected in a wire clamp device provided in a wire bonding apparatus according to the sixth embodiment of the present, invention.
Figure 12:
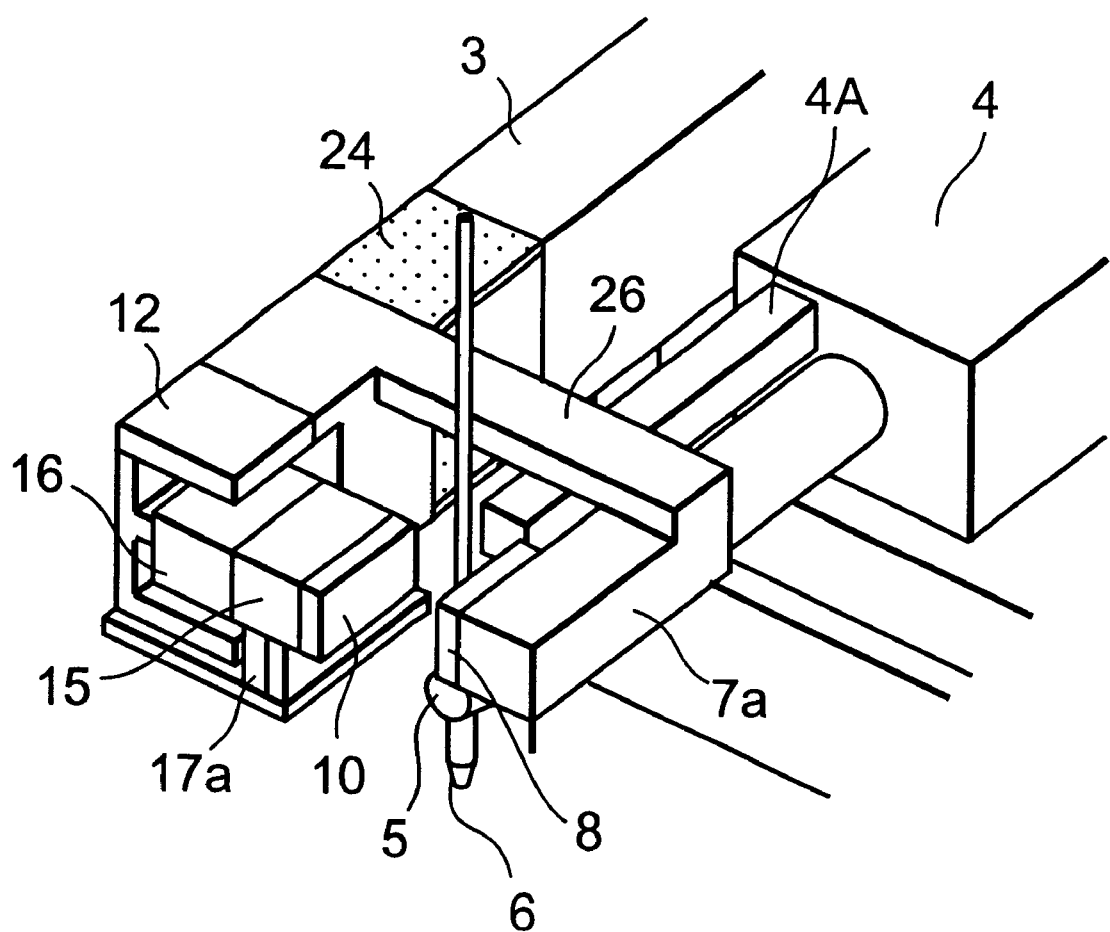
FIG. 12 is a partial enlarged view of a wire clamp device provided in a wire bonding apparatus according to the sixth embodiment of the present invention.

Next, a wire bonding apparatus according to a sixth embodiment of the present invention will be described with reference to FIGS. 10 through 12. FIGS. 10 and 11 are enlarged perspective views of the wire clamp portion of the wire clamp device provided in the wire bonding apparatus of the sixth embodiment. FIG. 10 shows a state in which the bonding arm and the actuator portions are separated from each other and FIG. 11 shows a state in which the bonding arm and the actuator portions are integrated with each other. FIG. 12 is an enlarged perspective view of the wire clamp portion of the wire clamp device, showing a case where the entire clamp device including entire clamp portions and entire actuator portions is separated from the bonding arm. This embodiment is characterized in that the wire clamp driving actuator portions 12 and 16 formed on the X–Y stage, or the entire clamp device including the actuator portions is integrated with the bonding arm which swings only when holding the gold wire 9.

As shown in FIGS. 10 and 11, the wire clamp device of this embodiment includes stationary and movable side actuator portions 12 and 16 fixed to the bonding head 3 by actuator supporting plate springs 24, a guide 17a guiding the movable side actuator portion 16, and the block 15 fixed to the movable side actuator portion 16 and adapted to operate the movable side wire clamp portion 7b.

In the wire clamp device, constructed as described above, when the bonding arm 4 operates without gripping the gold wire 9, the actuator portions are on the bonding head 3 without being in contact with the bonding arm 4. Only when the bonding arm 4 swings to clamp the gold wire 9, it comes into contact with the actuator portions to be integrated therewith. At this time, the actuator supporting plate springs 24 undergo the elastic deformation, whereby the actuator portions are integrated with the bonding arm 4 and operate with the bonding arm 4, thereby making it possible to achieve a reduction in the weight and inertia of the bonding arm 4.

In this embodiment, it is also possible to adopt an arrangement in which, instead of operating the entire wire clamp driving actuator portions, the movable side actuator portion 16 operates integrally with the bonding arm 4 only when gripping the gold wire 9.

Further, as shown in FIG. 12, it is also possible to separate the entire wire clamp portions including the stationary side wire clamp portion 7a and the stationary wire gripping portion 8 from the bonding arm 4 and fix it to the bonding head 3. In this case, it is possible to achieve a further reduction in the weight and inertia of the bonding arm 4. In FIG. 12, the stationary side wire clamp portion 7a and the stationary wire gripping part 8 is connected to the stationary side actuator portion 12 by a bridge member 26 so that the entire wire clamp device is fixed to the bonding head 3 by the actuator supporting plate springs 24, and only when gripping the gold wire 9, the wire clamp device including the stationary side wire clamp portion 7a and the stationary wire gripping part 8 is coupled with the bonding arm 4 series including the gold wire 9. The entire clamp device ascends by a protruded section 4A of the bonding arm 4 attached to the under face of the bride member 26, and descends by the spring action of the actuator supporting plate springs 24.

While in the above-described first through sixth embodiment a VCM is used as the actuator, this should not be construed restrictively. The actuator may also include a linear motor, electrostrictive element, magnetostrictive element, etc. Further, the structure of the force transmission mechanism of the fourth and fifth embodiments is not restricted to those of FIGS. 8 and 9. Any type of structure will be adopted as long as it can reliably transmit the driving force of the actuator to the wire gripping part.

As described above, in the wire bonding apparatus of the present invention, at least a section of the wire clamp portion and the actuator portion for operating the wire clamp or the force transmission mechanism is fixed onto the X–Y stage, whereby it is possible to achieve a reduction in the weight and inertia of the swinging bonding arm, making it possible to realize a high-speed bonding.

What is claimed is:

1. A wire bonding apparatus comprising an X–Y stage moving in X and Y-directions, a swinging shaft fixed onto said X–Y stage, a bonding arm swinging in the Z-axis direction perpendicular to said X and Y-directions, around said swinging shaft, a pair of wire clamp portions gripping a bonding wire, and an actuator for driving the pair of wire clamp portions,
wherein at least a section of said actuator and said wire clamp portions is separated from the bonding arm and fixed onto said X–Y stage.

2. A wire bonding apparatus according to claim 1, wherein a bonding head is secured to said X–Y stage, and said section of said actuator and said wire clamp portions is fixed onto said X–Y stage through said bonding head.

3. A wire bonding apparatus according to claim 1, wherein the entire sections of said actuator are separated from said bonding arm and fixed onto said X–Y stage.

4. A wire bonding apparatus according to claim 1, wherein said actuator is composed of a stationary side actuator portion and a movable side actuator portion movable along said stationary side actuator portion, and wherein said stationary side actuator portion is separated from said bonding arm and fixed onto said X–Y stage.

5. A wire bonding apparatus according to claims 1, wherein said actuator is connected to said X–Y stage by an elastic member, moves integrally with said bonding arm only when gripping said bonding wire, and is separated from said bonding arm when not gripping said bonding wire.

6. A wire bonding apparatus according to claims 5, wherein said wire clamp portions are connected to said X–Y stage by said elastic member, move integrally with said bonding arm only when gripping said bonding wire, and are separated from said bonding arm portion when not gripping said bonding wire.

7. A wire bonding apparatus according to claim 1, wherein a protrusion equipped with a freely rolling ball is provided in the wire clamp side end portion of said actuator, and wherein when said bonding arm swings in the Z-axis direction, said ball provided on said protrusion abuts said wire clamp portion while rolling to pressurize the wire clamp portion.

8. A wire bonding apparatus according to claim 1, wherein an actuator portion of said actuator is formed so as to be movable in the Z-axis direction, and wherein when said bonding arm swings in the Z-axis direction, said wire clamp portion and at least a section of said actuator move together while in contact with each other.

9. A wire bonding apparatus according to claim 1, wherein a movable side actuator portion of said actuator is formed as a plate extending in the Z-axis direction, and wherein when said bonding arm swings in the Z-axis direction, said movable side actuator portion pressurizes said wire clamp portion while deviating in the Z-axis direction.

10. A wire bonding apparatus according to claim 1, further comprising a driving force transmission means provided between said actuator and said wire clamp portion and separated from said bonding arm, wherein the pressurizing force of said actuator is transmitted to said wire clamp portion through said driving force transmission means.

11. A wire bonding apparatus according to claim 10, wherein said driving force transmission means is formed as a lever structure rotating around a fulcrum.

12. A wire bonding apparatus according to claim 10, wherein said driving force transmission means includes a pair of lever structures that are movable with said pair of wire clamp portions being sandwiched therebetween.

13. A wire bonding device according to any one of claim 1–12, wherein said actuator includes one of a VCM, a linear motor, an electrostrictive element, and a magnetostrictive element.

* * * * *